United States Patent
Lee et al.

(10) Patent No.: US 7,176,501 B2
(45) Date of Patent: Feb. 13, 2007

(54) TB,B-BASED YELLOW PHOSPHOR, ITS PREPARATION METHOD, AND WHITE SEMICONDUCTOR LIGHT EMITTING DEVICE INCORPORATING THE SAME

(75) Inventors: Dong-Yeoul Lee, Busan (KR); Yong-Tae Kim, Jeonju (KR); Jin-Hwan Kim, Iksan (KR); Eun-Joung Kim, Jeju-do (KR)

(73) Assignee: Luxpia Co, Ltd, Jeollabuk-Do (KR)

( * ) Notice: Subject to any disclaimer, the term of this patent is extended or adjusted under 35 U.S.C. 154(b) by 122 days.

(21) Appl. No.: 10/520,855

(22) PCT Filed: Nov. 25, 2003

(86) PCT No.: PCT/KR03/02550

§ 371 (c)(1),
(2), (4) Date: Jan. 11, 2005

(87) PCT Pub. No.: WO2004/099342

PCT Pub. Date: Nov. 18, 2004

(65) Prior Publication Data

US 2005/0269592 A1    Dec. 8, 2005

(30) Foreign Application Priority Data

May 12, 2003 (KR) ............... 10-2003-0029928
Jul. 15, 2003 (KR) ............... 10-2003-0048324
Nov. 21, 2003 (KR) ............... 10-2003-0083094

(51) Int. Cl.
*H01L 29/22* (2006.01)

(52) U.S. Cl. .................. 257/99; 257/98; 257/100; 257/101

(58) Field of Classification Search ........... 257/77–103
See application file for complete search history.

(56) References Cited

U.S. PATENT DOCUMENTS 6,943,379 B2 *   9/2005   Suehiro et al. ............... 257/99

(Continued)

FOREIGN PATENT DOCUMENTS

EP            1148110          10/2001

(Continued)

*Primary Examiner*—Cuong Nguyen
(74) *Attorney, Agent, or Firm*—Conley Rose, P.C.

(57) ABSTRACT

The present invention relates to a terbium borate-based yellow phosphor, a preparation method thereof, and a white semiconductor light emitting device incorporating the same. The terbium borate-based yellow phosphor of the present invention is represented by the general formula $(Tb_{1-x-y-z}RE_xA_y)_3D_aB_bO_{12}:Ce_z$ (where, RE is at least one rare earth element selected from the group consisting of Y, Lu, Sc, La, Gd, Sm, Pr, Nd, Eu, Dy, Ho, Er, Tm and Yb; A is a typical metal element selected from the group consisting of Li, Na, K, Rb, Cs and Fr; D is a typical amphoteric element selected from the group consisting of Al, In and Ga; $0 \leq x < 0.5$; $0 \leq y < 0.5$; $0 < z < 0.5$; $0 < a < 5$; and $0 < b < 5$). The white semiconductor light emitting device of the present invention comprises a semiconductor light emitting diode and the yellow phosphor, which absorbs a portion of light emitted by the semiconductor light emitting diode and emits light of wavelength different from that of the absorbed light. It offers white light from the combination of the light emitted by the semiconductor light emitting diode and the light emitted by the yellow phosphor. The white semiconductor light emitting device of the present invention offers a greatly improved color rendering and experiences less deterioration in light emission efficiency over a long period of service.

16 Claims, 4 Drawing Sheets

U.S. PATENT DOCUMENTS

2003/0230757 A1* 12/2003 Suehiro et al. .............. 257/99
2005/0145868 A1* 7/2005 Kummer et al. .............. 257/98

FOREIGN PATENT DOCUMENTS

| | | |
|---|---|---|
| JP | 2000-226576 | 8/2000 |
| KR | 1020010067240 | 12/2001 |
| WO | WO98/05078 | 5/1998 |

* cited by examiner

TB,B-BASED YELLOW PHOSPHOR, ITS PREPARATION METHOD, AND WHITE SEMICONDUCTOR LIGHT EMITTING DEVICE INCORPORATING THE SAME

BACKGROUND OF THE INVENTION (a) Field of the Invention

The present invention relates to a semiconductor light emitting device. More particularly, it relates to a terbium borate-based yellow phosphor, a preparation method thereof, and a semiconductor light emitting device incorporating the yellow phosphor which absorbs a portion of light emitted by a light emitting diode, and emits light of wavelength different from that of the absorbed light, thereby implementing such white light as purely white light and bluish white light by incorporating the yellow phosphor.

(b) Description of the Related Art

A semiconductor light emitting diode (LED) is a PN-junctioned compound semiconductor. It is a kind of optoelectronic device that emits light energy corresponding to the band gap of a semiconductor generated by a combination of an electron and a hole when a voltage is applied.

As full colorization of LED was realized with the development of high luminance blue LED using a GaN-based nitride semiconductor fluorescent material, application of LEDs are expanding from display devices to illumination devices. LEDs offer about 10 to 15% less power consumption compared with conventional illumination devices such as fluorescence bulbs and incandescent bulbs, semi-permanent life of over 100,000 hours, and environmental friendliness, when used for illumination devices, so that they can significantly improve energy efficiency. For a semiconductor light emitting diode to be used for illumination purpose, white light should be obtainable using LEDs. Largely, three methods of fabricating white semiconductor light emitting devices have been used. One of them is to obtain white light by combining three LEDs of red, green and blue colors. In this method, an InGaN or AlInGaP phosphor is used as a fluorescent material. According to this method, it is difficult to constructing three RGB LEDs on a single chip and it is difficult to control a current strength because each LED is made from different material and by different method, and driving voltage of each LED is different. In another method, a UV LED is used as a light source to excite a three-color (RGB) phosphor to obtain white light. It uses an InGaN/R,G,B phosphor as a fluorescent material. This method is applicable under a high current and improves color sensation. However, the above two methods have the following problems: a satisfactory material to obtain green light has not been developed as yet; and light emitted from the blue LED may be absorbed by the red LED to lower the overall light emitting efficiency. As an alternative method, a blue LED is used as a light source to excite a yellow phosphor to obtain white light. In general, an InGaN/YAG:Ce phosphor is used as a fluorescent material in this method.

When a phosphor is used, it's emitting efficiency increases as a difference in wavelengths of an exciting radiation and an emitted radiation gets small. Thus, the light emitting characteristic of a phosphor plays a very important role in determining the color and luminance of a semiconductor light emitting device incorporating thereof. Generally, a phosphor includes a matrix made of a crystalline inorganic compound and an activator that converts the matrix into an effective fluorescent material. It emits light mainly in the visible wavelength region when an electron excited by absorbing a variety form of energies returns to its ground state. The color of emitted light can be adjusted by controlling the combination of the matrix and activator.

Examples of white semiconductor light emitting devices are disclosed in many documents.

U.S. Pat. Nos. 5,998,925 and 6,069,440 (Nichia Kagaku Kogyo Kabushiki Kaisha) disclose a white semiconductor light emitting device using a nitride semiconductor, which comprises a blue light emitting diode containing the nitride semiconductor represented by the formula: $In_iGa_jAl_kN$ ($0 \leq i, 0 \leq j, 0 \leq k, i+j+k=1$) and a yellow phosphor containing a YAG (yttrium, aluminum, garnet)-based garnet fluorescent material that absorbs a portion of light emitted from the blue light emitting diode and emits light of wavelength different from that of the absorbed light. For the YAG-based phosphor, a mixture of a first phosphor, $Y_3(Al_{1-S}Ga_S)_5O_{12}:Ce$, and a second phosphor, $RE_3Al_5O_{12}:Ce$, ($0 \leq s \leq 1$; RE is at least one of Y, Ga and La) are used.

U.S. Pat. No. 6,504,179 (Osram Optosemiconductors GmbH) discloses a white-emitting illuminating unit using a BYG approach (combination of blue, yellow and green) instead of the conventional RGB approach (combination of red, green and blue) or BY approach (combination of blue and yellow). This white-emitting illumination unit has an LED emitting a first light in the range of 300 nm to 470 nm as a light source, and the first light is converted into light of longer wavelength by the phosphor exposed to the first light. To aid the conversion, a Eu-activated calcium magnesium chlorosilicate-based green phosphor and a Ce-activated rare earth garnet-based yellow phosphor is used. For the Ce-activated rare earth garnet-based yellow phosphor, a phosphor represented by the formula $RE_3(Al, Ga)_5O_{12}:Ce$ (RE is Y and/or Tb), at least 20% of the total emission of which lies in the visible region of over 620 nm, is used.

U.S. Pat. No. 6,596,195 of General Electric discloses a phosphor which is excitable between the near UV and blue wavelength region (ranging from about 315 nm to about 480 nm) and has an emission peak between the green to yellow wavelength region (ranging from about 490 nm to about 770 nm), and a white light source incorporating the same. This phosphor has a garnet structure and is represented by the formula: $(Tb_{1-x-y}A_xRE_y)_3D_zO_{12}$ (A is selected from the group consisting of Y, La, Gd and Sm; RE is selected from the group consisting of Ce, Pr, Nd, Sm, Eu, Gd, Dy, Ho, Er, Tm, Yb and Lu; D is selected from the group consisting of Al, Ga and In; A is selected such that A is different from RE; x is in the range from 0 to 0.5; y is in the range from 0.0005 to 0.2; and z is in the range from 4 to 5).

As described above, conventional white semiconductor light emitting devices excite YAG-based yellow phosphors to emit light mainly using UV to blue LEDs and obtain white light from combination thereof. However, the YAG-based yellow phosphor emits yellowish green light, and if other materials are added in place of yttrium and aluminum to cause a change in emitted light toward a longer wavelength, the emitting luminance is reduced.

SUMMARY OF THE INVENTION

Thus, an object of the present invention is to solve the problems described above and provide a phosphor that can improve the emitting luminance and color rendering of a white light emitting device, a preparation method thereof, and a white semiconductor light emitting device which experiences only extremely low degrees of deterioration in emission intensity, emission efficiency and color shift over a long period of service and implements wide range of colors.

Thus, the present invention provides a terbium borate-based yellow phosphor represented by the following general formula:

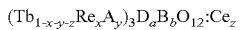

$(Tb_{1-x-y-z}Re_xA_y)_3D_aB_bO_{12}:Ce_z$

In the formula, Re is at least one rare earth element selected from the group consisting of Y, Lu, Sc, La, Gd, Sm, Pr, Nd, Eu, Dy, Ho, Er, Tm and Yb; A is at least one typical metal element selected from the group consisting of Li, Na, K, Rb, Cs and Fr; D is at least one typical amphoteric element selected from the group consisting of Al, In and Ga; $0 \leq x < 0.5$; $0 \leq y < 0.5$; $0 < z < 0.5$; $0 < a < 5$; and $0 < b < 5$.

The present invention also provides a preparation method of a terbium borate-based yellow phosphor, which comprises: preparing a precursor solution including a compound containing at least one element selected from the group consisting of aluminum, indium and gallium, a terbium-containing compound, a cerium-containing compound and boric acid; forming droplets by spraying the precursor solution; and heat treating the liquid drops at 800 to 1800° C. after drying and pyrolyzing them at 200 to 1500° C.

The present invention further provides a white semiconductor light emitting device comprising a semiconductor light emitting diode and a phosphor coating layer comprising a yellow phosphor, which absorbs a portion of light emitted from the semiconductor light emitting diode and emits light of wavelength different from that of the absorbed light, and a transparent resin, wherein the yellow phosphor comprises cerium-activated terbium, boron and an amphoteric typical element, and the amphoteric typical element is selected from the group consisting of Al, In and Ga.

The present invention also provides a lead type white semiconductor light emitting device, which comprises: a mount lead comprising a lead and a recess portion in the lead; a blue light emitting LED chip which is disposed in the recess portion, and anode and cathode of which are connected to the lead of the mount lead by metal wires; a phosphor coating layer filled inside the recess portion to cover the LED chip; and a casing that seals the mount lead (excluding a lower part of the mount lead), the LED chip and phosphor coating layer, wherein the phosphor coating layer comprises a transparent resin and a terbium borate-based yellow phosphor represented by the general formula above.

The present invention further provides a surface mount type white semiconductor light emitting device, which comprises: a casing having a recess portion disposed thereon and equipped with metal terminals; a blue light emitting LED chip which is disposed in the recess portion, and anode and cathode of which are connected to the metal terminals by metal wires; and a phosphor coating layer filled inside the recess portion to cover the LED chip, wherein the phosphor coating layer comprises a transparent resin and a terbium borate-based yellow phosphor represented by the general formula above.

The white semiconductor light emitting device of the present invention may be used for a back light source of a liquid crystal display (LCD).

DETAILED DESCRIPTION OF THE PREFERRED EMBODIMENTS

Figure 1:
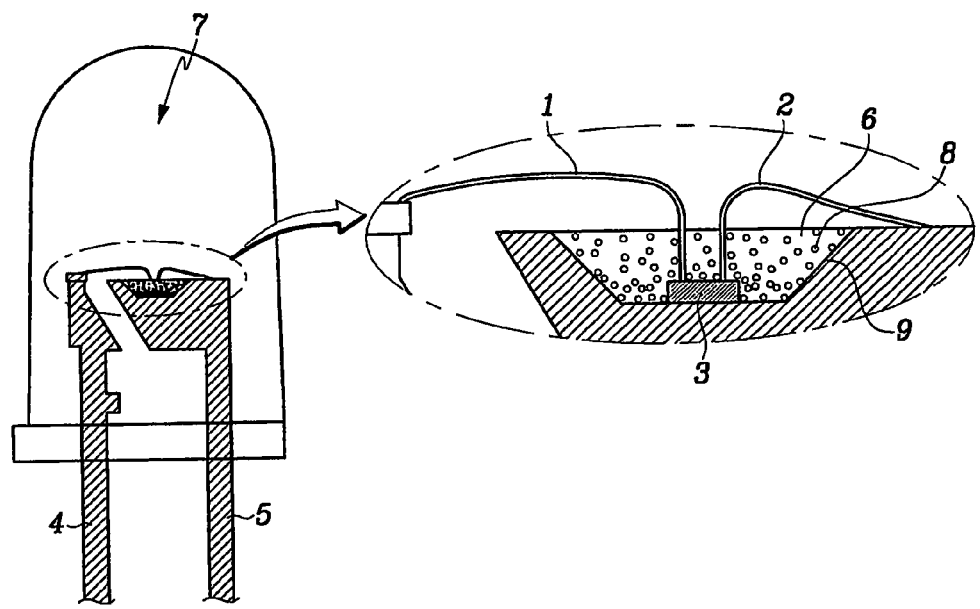
FIG. 1 is a schematic view of a lead type white semiconductor light emitting device incorporating a terbium borate-based yellow phosphor in accordance with one embodiment of the present invention, and partial enlarged view thereof.

Hereinafter, the present invention is described in more detail.

The yellow phosphor provided by the present invention comprises cerium-activated terbium, boron and an amphoteric typical element, and as the amphoteric typical element, Al, In, Ga or their mixture is used.

Preferably, the yellow phosphor of the present invention is a terbium borate-based phosphor represented by the following general formula:

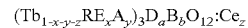

$(Tb_{1-x-y-z}RE_xA_y)_3D_aB_bO_{12}:Ce_z$

In the formula, RE is at least one rare earth element selected from the group consisting of Y, Lu, Sc, La, Gd, Sm, Pr, Nd, Eu, Dy, Ho, Er, Tm and Yb; A is at least one typical metal element selected from the group consisting of Li, Na, K, Rb, Cs and Fr, D is at least one typical amphoteric element selected from the group consisting of Al, In and Ga; $0 \leq x < 0.5$; $0 \leq y < 0.5$; $0 < z < 0.5$; $0 < a < 5$; and $0 < b < 5$.

Preferably, x, y, and z are selected to satisfy: $0 < x+y+z < 1$, and more preferably, $0 < x+y+z < 0.5$. In the formula above, preferably, a and b are selected to satisfy $4 \leq a+b \leq 7$, and more preferably, $4 \leq a+b \leq 6$. Also, it is preferable to select x, y and z to satisfy: $0.05 \leq x < 0.3$; $0.05 \leq y < 0.25$; and $0.005 \leq z < 0.015$.

In the above general formula, a desirable light emission efficiency can be obtained when x and z are in the described ranges. Also, Ce can satisfactorily act as an activator when y lies in the above range. If they fall outside the range, the luminance may be decreased due to the quenching effect. The yellow phosphor has an absorption peak at about 420 nm to 480 nm and an emission peak at about 530 nm to 570 nm.

The terbium borate-based yellow phosphor can be prepared by several methods known to one of ordinary in the art, including the solid phase method, liquid phase method and gas phase method.

In the preparation of a terbium borate-based phosphor powder according to the present invention, the phosphor structure may become different depending on a metal compound for forming the phosphor matrix and a metal compound doped into the matrix. Now, preparation of a phosphor by the gas phase method will be described in detail.

In the gas phase method, a phosphor is prepared by three steps of: (1) preparing a precursor solution by dissolving terbium, aluminum and cerium compounds and boric acid in a solvent; (2) supplying the precursor solution to a spraying unit to form droplets; and (3) drying, pyrolyzing and heat treating the droplets using a spraying and pyrolyzing unit.

<Step 1: Preparation of Spray Solution>

In preparing a precursor spray solution to obtain a phosphor powder, a terbium compound, an aluminum compound, a boron compound, etc. are used for preparing a phosphor powder matrix, and a cerium compound is used for preparing an activator to dope into the matrix. Water or alcohol is used as a solvent to dissolve the metal compounds for phosphor matrix, and as the matrix metal compound, nitrates, acetates, chlorides, hydroxides or oxide forms that easily dissolve in the solvent are used.

Because the phosphor particle size is determined by the concentration of the precursor solution, the concentration of the precursor solution should be controlled to obtain particles of a desirable size. Preferably, the concentration is controlled in the range of 0.002 M to 3.0 M. If the concentration is below 0.002 M, the phosphor powder yield decreases. Otherwise, if it is over 3.0 M, the precursor solution is not sprayed well due to the solubility problem.

<Step 2: Spraying Droplets>

The obtained precursor solution is supplied to a spraying unit and sprayed as liquid droplets, It is preferable that the diameter of the liquid drop lies in the range of from 0.1 to 100 μm in consideration of the final phosphor particle size. For the spraying unit, an ultrasonic spraying unit, air nozzle spraying unit, ultrasonic nozzle spraying unit, etc. can be used. When an ultrasonic spraying unit is used, fine phosphor powders of sub-micron dimension can be prepared in high concentration, and when an air nozzle or ultrasonic nozzle units are used, particles of micron to sub-micron dimensions can be prepared in large scale. To obtain phosphor powders, an ultrasonic liquid drop generation unit, which produces fine liquid drops having a size of several microns, is preferable.

<Step 3: Preparation of Phosphor Powder>

Fine liquid drops formed by the liquid drop generation unit are converted to phosphor particle precursors in a hot tube reactor. Preferably, the temperature of the reaction electric furnace is maintained in the range from 200 to 1,500° C., which is the range that the precursor materials can be dried and pyrolyzed. In the spraying and pyrolyzing step, the liquid drops pass through the reactor within a few seconds. Therefore, heat treatment is performed for crystal growth of the phosphor particles. This heat treatment is performed at a temperature range of 800 to 1,800° C., more preferably 1,100 to 1,300° C. for 1 to 20 hours. The heat treatment temperature may be varied depending on the phosphor.

The terbium borate-based yellow phosphor absorbs a portion of light emitted from the blue LED and emits light of wavelength different from that of the absorbed light, and white color is implemented from combination of blue and yellow. Accordingly, the terbium borate-based yellow phosphor of the present invention can be used for a white semiconductor light emitting device.

The white semiconductor light emitting device according to one embodiment of the present invention comprises a blue light emitting LED, as a light source, and the terbium borate-based yellow phosphor. The LED comprises a substrate made of sapphire or silicon carbide and a GaN, InGaN, AlGaN or AlGaInN nitride semiconductor whose main emission spectrum peak lies in the range from 400 nm to 530 nm. Preferably, the main emission wavelength of the yellow phosphor is longer than the main peak wavelength of the nitride semiconductor.

In the white semiconductor light emitting device according to one embodiment of the present invention, the yellow phosphor is contained at the phosphor coating layer on top of the semiconductor light emitting diode, in combination with the transparent resin. For the transparent resin, any resin available in the art for such purpose can be used. Preferably, an epoxy resin or a silicone resin is used. The phosphor coating layer may further comprise a zinc selenium-based red phosphor. Preferably, the zinc selenium-based red phosphor is contained in 1 to 40 wt %, more preferably 10 to 20 wt %, based on the weight of the terbium borate-based phosphor.

The white semiconductor light emitting device of the present invention can be fabricated in surface mount type or lead type during the packaging process. Such materials as metal stem, lead frame, ceramic, printed circuit board, etc. can be used for packaging. The packaging is performed to protect the device from electric connection with outside and from external mechanical, electric and environmental factors, offer a heat dissipation path, increase the light emission efficiency, optimize orientation, and so forth.

FIG. 1 shows an example of a lead type white semiconductor light emitting device. The lead type white semiconductor light emitting device comprises a cup-shaped recess portion 9 on top of a lead frame, an LED chip 3 and a phosphor coating layer 6 at the recess portion 9. The LED chip 3 is connected to an anode lead 4 and a cathode lead 5 by metal wires 1, 2. A portion of the anode lead 4 and cathode lead 5 is exposed to outside and all the other components are sealed in a casing 7 made of transparent or colored light-transmitting material. The inner wall of the recess portion 9 acts as a reflection plate, and the phosphor coating layer 6 comprises yellow phosphor particles 8 and a transparent epoxy resin or silicone resin.

Figure 2:
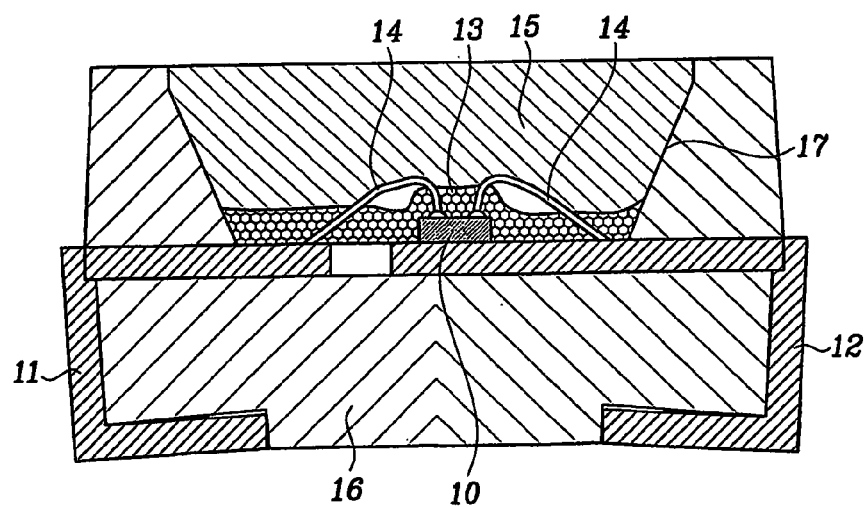
FIG. 2 is a schematic view of a surface mount type white semiconductor light emitting device of the reflector injection type incorporating a terbium borate-based yellow phosphor in accordance with another embodiment of the present invention.

FIG. 2 shows an injection molded-reflector type white semiconductor light emitting device as an example of the surface mount type device. In FIG. 2, the white semiconductor light emitting device has a casing 16 on which a recess portion 17 is located. The casing 16 has metal terminals 11, 12 which act anode lead and cathode lead. The LED chip 10 and the metal terminals 11, 12 are connected to N type electrode and P type electrode, respectively, by metal wires 14. The LED chip 10 is located in the recess portion. Over the LED chip, a phosphor coating layer 13 comprising a transparent resin and yellow phosphor particles is disposed, and over the phosphor coating layer 13, a molding layer 15 is disposed such that it lies in the same plane with an upper end of the recess portion 17, so that the metal wires are buried inside and not exposed to outside. The inner wall of the recess portion 17 acts as a reflection plate, and the recess portion 17 may be prepared by injection molding.

Figure 3:
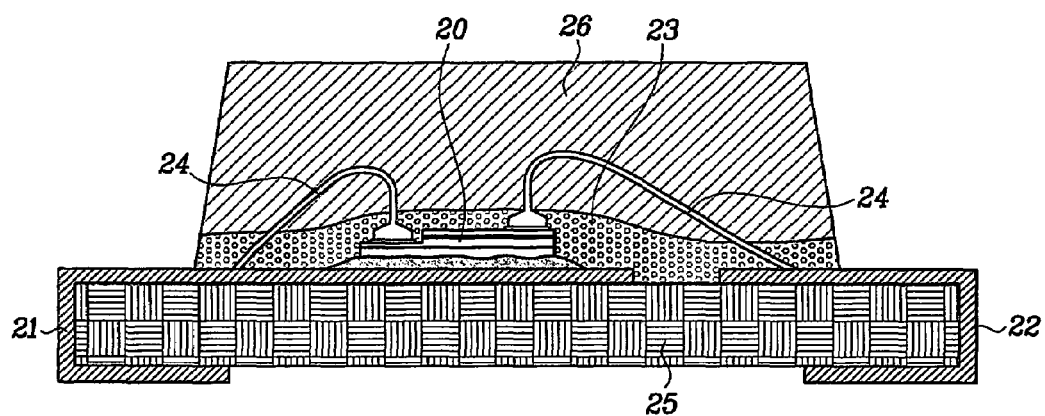
FIG. 3 is a sectional view of a surface mount type white semiconductor light emitting device of the PCB type incorporating a terbium borate-based yellow phosphor in accordance with another embodiment of the present invention.

FIG. 3 shows an example of a PCB (printed circuit board) type surface mounted white semiconductor light emitting device. As shown in FIG. 3, an LED chip 20 is located on top of a PCB layer 25, and an anode lead 22 and a cathode lead 21 are connected to N type electrode and the P type electrode of the LED chip 20, respectively, by metal wires 24. Over the LED chip 20, a phosphor coating layer 23 and a molding layer 26 are disposed in that order. The phosphor coating layer 23 comprises a transparent resin and the terbium borate-based yellow phosphor of the present invention.

When the height of the mounted LED chip is 100 μm, it is preferable that the thickness of the yellow phosphor coating layer from the bottom of the recess portion lies in the range of from 100 μm to 300 μm, that is about one to three times the height of the LED chip, more preferably in the range of from 150 μm to 250 μm. If the filling height is below 100 μm, the surface of the chip is not sufficiently coated by the phosphor, so that it is difficult to obtain white color. Otherwise, if it is over 300 μm, the light emitting characteristic of the semiconductor light emitting device is deteriorated due to the optical interruption and attenuation by the phosphor.

The LED chip used in the white semiconductor light emitting device as a light source comprises a sapphire or silicon carbide substrate and a GaN, InGaN or AlGaInN nitride semiconductor.

Figure 4:
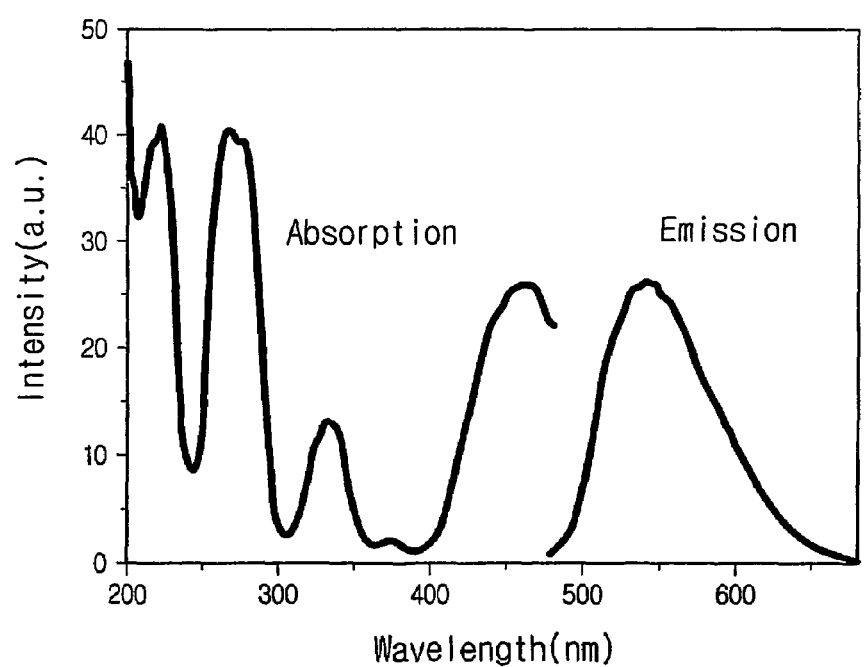
FIG. 4 is a graph showing the absorption spectrum and emission spectrum of a terbium borate-based yellow phosphor according to one embodiment of the present invention.

FIG. 4 shows the absorption spectrum and emission spectrum of the terbium borate-based yellow phosphor according to one embodiment of the present invention. The absorption spectrum shows a high absorption peak at 400 nm to 470 nm region, and the emission spectrum shows a high emission peak at about 530 nm. Since it emits deep yellow light without using an additive, it can solve the emitting luminance decrease due to additives. Therefore, the terbium borate-based yellow phosphor of the present invention can be effectively used for implementing white light in combination with a blue LED chip.

Figure 5:
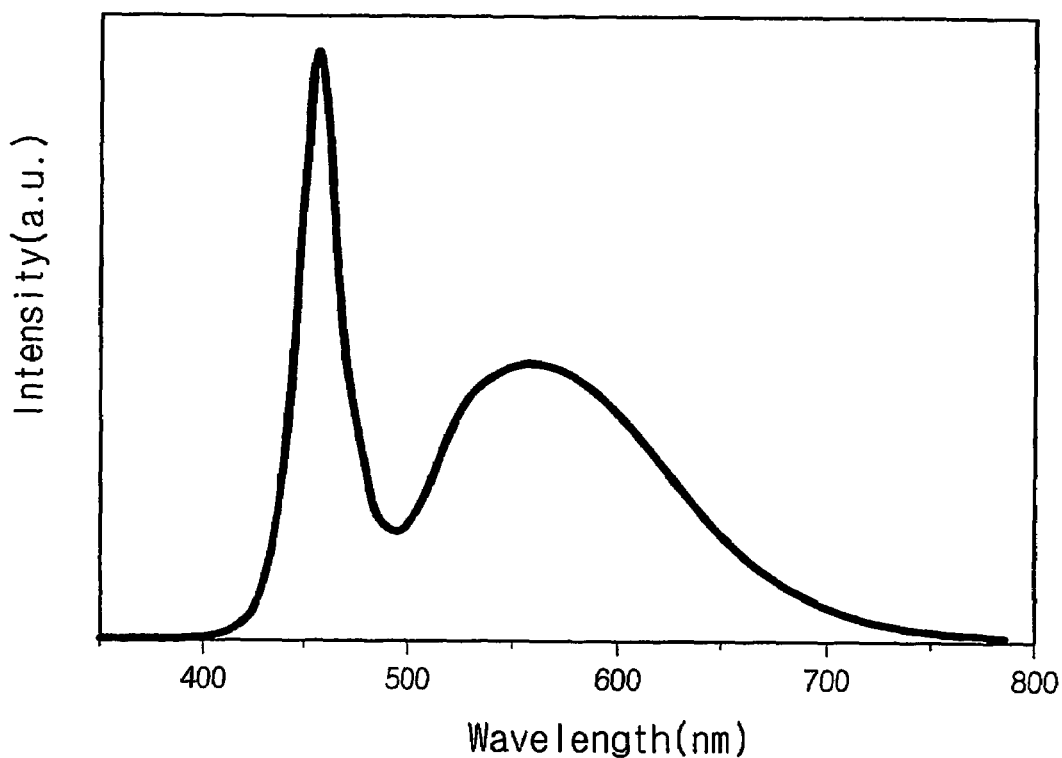
FIG. 5 is a graph showing the emission spectrum of a white semiconductor light emitting device in which the terbium borate-based yellow phosphor of FIG. 4 is combined with a blue LED.

FIG. 5 shows the emission spectrum of a white emitting diode prepared from combination of a terbium borate-based yellow phosphor and a blue LED. As seen in FIG. 5, the yellow phosphor absorbs a portion of light emitted from the blue LED chip and emits a second light of wavelength different from that of the absorbed light, thus the combination of the second light and the reference light produces white light.

The white semiconductor light emitting device of the present invention may further comprise a zinc selenium-based red phosphor in addition to the yellow phosphor. Preferably, the zinc selenium-based red phosphor is included in 1 to 40 wt % based on the weight of the yellow phosphor.

Figure 6:
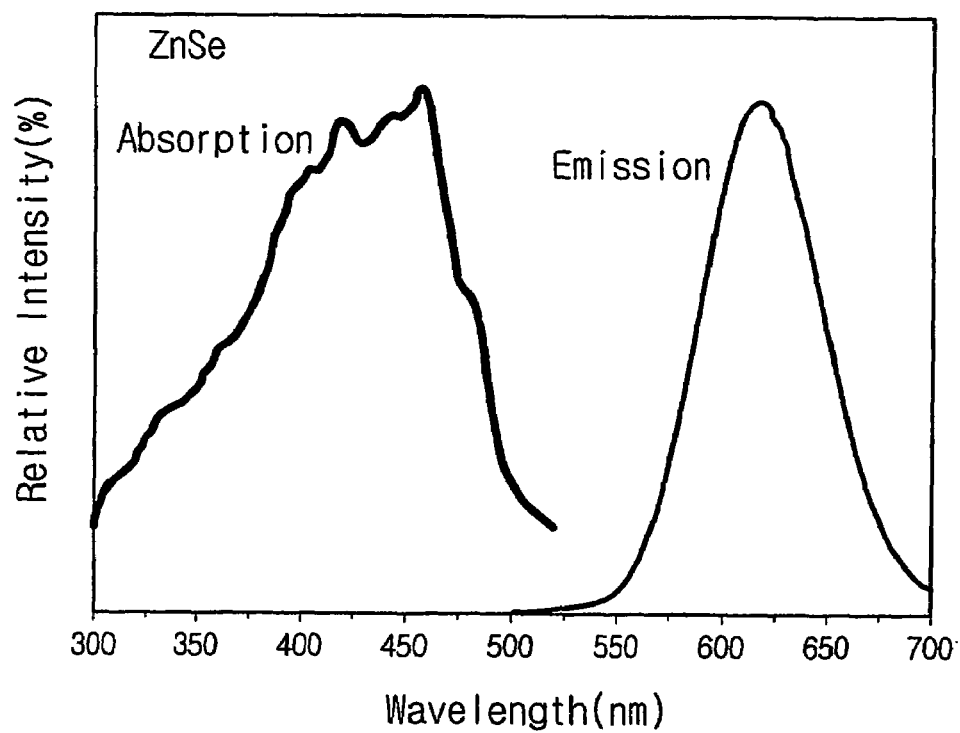
FIG. 6 is a graph showing the absorption spectrum and emission spectrum of a zinc selenium-based red phosphor.

FIG. 6 shows the absorption spectrum and emission spectrum of the zinc selenium-based red phosphor. The absorption spectrum shows a high absorption peak at 400 to 475 nm region, and the emission spectrum shows a high emission peak at about 620 nm. Accordingly, the zinc selenium-based red phosphor can be effectively used for implementing red light in combination with a UV chip and pink light in combination with a blue chip.

Figure 7:
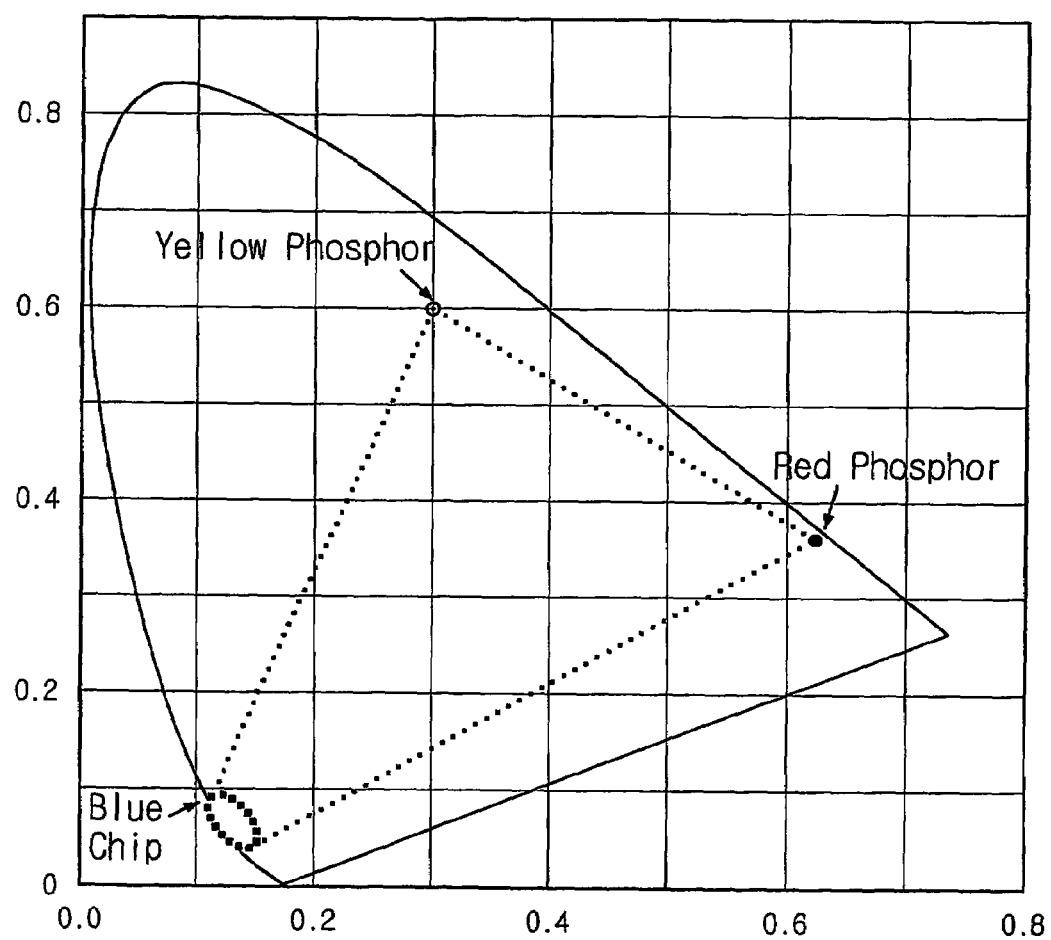
FIG. 7 is a color coordinate showing the colorization range that can be implemented by a light emitting diode in which a borate-based yellow phosphor, a zinc selenium-based red phosphor and a blue LED.

FIG. 7 is a color coordinate showing the colorization range that can be obtained by a light emitting diode including a borate-based yellow phosphor, a zinc selenium-based red phosphor and a blue LED. Colors belonging to the color coordinate can be obtained by the selection of the blue chip (in the range from 420 to 480 nm), and controlling the mixing proportion of the terbium borate-based yellow phosphor and zinc selenium-based red phosphor.

Accordingly, the white semiconductor light emitting device of the present invention produces white light, by incorporating the terbium borate-based yellow phosphor to a semiconductor light emitting diode containing a blue light emitting nitride semiconductor.

Further, the white emitting diode of the present invention incorporating the terbium borate-based yellow phosphor and the zinc selenium-based red phosphor experiences only extremely low degrees of deterioration in emission luminance and color shift over a long period of service, and is capable of offering white and bluish white colors.

As described above, the terbium borate-based yellow phosphor of the present invention absorbs a portion of light in the blue wavelength region emitted from a light emitting diode and emits light of wavelength different from that of the absorbed light to produce white color. Therefore, it can be applied in such LED fields that light of blue region is used as an energy source. Particularly, it is suitable as a back light source of LCDs since it has superior emission luminance and color rendering. While the present invention has been described in detail with reference to the preferred embodiments, those skilled in the art will appreciate that various modifications and alterations can be made thereto without departing from the spirit and scope of the present invention as set forth in the appended claims.

What is claimed is:

1. A terbium borate-based yellow phosphor represented by the following general formula:

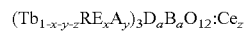

$(Tb_{1-x-y-z}RE_xA_y)_3D_aB_aO_{12}:Ce_z$ wherein: RE is at least one rare earth element selected from the group consisting of Y, Lu, Sc, La, Gd, Sm, Pr, Nd, Eu, Dy, Ho, Er, Tm and Yb; A is at least one typical metal element selected from the group consisting of Li, Na, K, Rb, Cs and Fr; D is at least one typical amphoteric element selected from the group consisting of Al, In and Ga; $0 \leq x<0.5; 0\leq y<0.5; 0<z<0.5; 0<a<5$; and $0<b<5$.

2. The terbium borate-based yellow phosphor according to claim 1, wherein x, y, z, a and b are selected to satisfy: $0<x+y+z<1$; and $4 \leq a+b \leq 7$.

3. The terbium borate-based yellow phosphor according to claim 1, wherein the phosphor has an absorption peak in the range from about 420 nm to 480 nm and an emission peak in the range from about 530 nm to 570 nm.

4. A white semiconductor light emitting device comprising:

a semiconductor light emitting diode; and a phosphor coating layer comprising a yellow phosphor that absorbs a portion of light emitted by said semiconductor light emitting diode and emits light of wavelength different from that of the absorbed light and a transparent resin:

wherein said yellow phosphor comprises cerium-activated terbium, boron and aniphoteric typical element, and said amphoteric typical element is selected from a group consisting of Al, In and Ga, and the mixture of the foregoing.

5. The white semiconductor light emitting device according to claim 4, wherein said phosphor is represented by the following general formula:

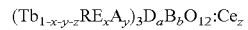

$(Tb_{1-x-y-z}RE_xA_y)_3D_aB_bO_{12}:Ce_z$ wherein: RE is at least one rare earth element selected from the group consisting of Y, Lu, Sc, La, Gd, Sm, Pr; Nd, Eu, Dy, Ho, Er, Tm and Yb; A is at least one typical metal element selected from the group consisting of Li, Na, K, Rb, Cs and Fr; D is at least one typical amphoteric element selected from the group consisting of Al, In and Ga; $0 \leq x<0.5; 0\leq y<0.5; 0<z<0.5; 0<a<5$; and $0<b<5$.

6. The white semiconductor light emitting device according to claim 4, wherein said yellow phosphor has an absorption peak in the range from about 420 nm to 480 nm and an emission peak in the range from about 530 nm to 570 nm.

7. The white semiconductor light emitting device according to claim 4, wherein said semiconductor light emitting diode comprises a substrate and a nitride semiconductor layer on top of the substrate.

8. The white semiconductor light emitting device according to claim 7, wherein said substrate is made of sapphire or silicon carbide.

9. The white semiconductor light emitting device according to claim 7, wherein said nitride semiconductor layer includes a GaN, InGaN, AlGaN or AlCaInN-based semiconductor.

10. The white semiconductor light emitting device according to claim 4, wherein said phosphor coating layer further comprises a zinc selenium-based red phosphor.

11. The white semiconductor light emitting device according to claim 10, wherein the content of said zinc selenium-based red phosphor is 1 to 40 wt % based on the weight of the yellow phosphor.

12. The white semiconductor light emitting device according to claim 4, wherein said transparent resin is a transparent epoxy resin or silicone resin.

13. A lead type white semiconductor light emitting device comprising:
a mount lead comprising a lead and a recess portion on said lead;
a blue light emitting LED chip which is disposed in said recess portion, and anode and cathode of which are connected to the lead of said mount lead by metal wires;
a phosphor coating layer filled inside said recess portion to cover said LED chip; and
a casing that seals the mount lead excluding lower portions of said mount lead, said LED chip and phosphor coating layer:
wherein said phosphor coating layer comprises a transparent resin and a terbium borate-based yellow phosphor represented by the following general formula:

$(Tb_{1-x-y-z}RE_xA_y)_3D_aB_bO_{12}:Ce_z$ wherein: RE is at least one rare earth element selected from the group consisting of Y, Lu, Sc, La, Gd, Sm, Pr, Nd, Eu, Dy, Ho, Er, Tm and Yb; A is at least one typical metal element selected from the group consisting of Li, Na, K, Rb, Cs and Fr; D is at least one typical amphoteric element selected from the group consisting of Al, In and Ga; $0 \leq x < 0.5; 0 \leq y < 0.5; 0 < z < 0.5; 0 < a < 5$; and $0 < b < 5$.

14. A surface mount type white semiconductor light emitting device of an injection-molded reflector type comprising:
a casing having a recess portion at a top thereof and equipped with metal terminals;
a blue light emitting LED chip which is located in said recess portion, and anode and cathode of which are connected to said metal terminals by metal wires; and
a phosphor coating layer filled inside said recess portion to cover said LED chip:
wherein said phosphor coating layer comprises a transparent resin and a terbium borate-based yellow phosphor represented by the following general formula:

$(Tb_{1-x-y-z}RE_xA_y)_3D_aB_bO_{12}:Ce_z$ wherein: RE is at least one rare earth element selected from the group consisting of Y, Lu, Sc, La, Gd, Sm, Pr, Nd, Eu, Dy, Ho, Er, Tm and Yb; A is at least one typical metal element selected from the group consisting of Li, Na, K, Rb, Cs and Fr; D is at least one typical amphoteric element selected from the group consisting of Al, In and Ga; $0 \leq x < 0.5; 0 \leq y < 0.5; 0 < z < 0.5; 0 < a < 5$; and $0 < b < 5$.

15. A surface mount type white semiconductor light emitting device of the PCB (printed circuit board) type comprising a blue L.E.D chip and a phosphor coating layer on a PCB layer, wherein said phosphor coating layer comprises a terbium borate-based yellow phosphor represented by the following general formula:

$(Tb_{1-x-y-z}RE_xA_y)_3D_aB_bO_{12}:Ce_z$ wherein: RE. is at least one rare earth element selected from the group consisting of Y, Lu, Sc, La, Gd, Sm, Pr, Nd, Eu, Dy, Ho, Er, Tm and Yb; A is at least one typical metal element selected from the group consisting of Li, Na, K, Rb, Cs and Fr; D is at least one typical amphoteric element selected from the group consisting of Al, In and Ga; $0 \leq x < 0.5; 0 \leq y < 0.5; 0 < z < 0.5; 0 < a < 5$; and $0 < b < 5$.

16. A liquid crystal display incorporating the white semiconductor light emitting device according to any one of claims 4 to 12 as a back light source.

* * * * *